(12) United States Patent
Allinger et al.

(10) Patent No.: US 6,646,503 B2
(45) Date of Patent: Nov. 11, 2003

(54) CIRCUIT CONFIGURATION FOR DETECTING A FUNCTIONAL DISTURBANCE

(75) Inventors: Robert Allinger, Unterhaching (DE); Siegfried Tscheternigg, Vilgertshofen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/298,833

(22) Filed: Nov. 18, 2002

(65) Prior Publication Data

US 2003/0080812 A1 May 1, 2003

Related U.S. Application Data

(63) Continuation of application No. PCT/DE01/01238, filed on Mar. 29, 2001.

(30) Foreign Application Priority Data

May 17, 2000 (EP) ............................................. 00110543

(51) Int. Cl.⁷ ................................................. H03F 3/45
(52) U.S. Cl. .............................. 330/69; 372/62; 372/58; 372/65

(58) Field of Search ............................. 327/62, 52, 55, 327/58, 63, 64, 65; 330/69

(56) References Cited

U.S. PATENT DOCUMENTS

| 4,495,471 A | | 1/1985 | Barrett | |
| 4,912,420 A | * | 3/1990 | Parnell | ......................... 327/58 |

FOREIGN PATENT DOCUMENTS

| EP | 0 550 389 A1 | 7/1993 |
| EP | 0 701 194 A1 | 3/1996 |
| JP | 20000055967 | * 2/2000 |

* cited by examiner

*Primary Examiner*—Michael B. Shingleton
(74) *Attorney, Agent, or Firm*—Laurence A. Greenberg; Werner H. Stemer; Ralph E. Locher

(57) ABSTRACT

A circuit configuration for detecting a functional disturbance has a first and a second differential amplifier. The outputs of the differential amplifiers are connected to the inputs of a gate. One input of the differential amplifiers is in each case connected to a reference potential terminal. The respective other input of the first and second differential amplifiers is connected to a monitoring means, which responds in the event of a change in the supply voltage at a supply potential terminal of the circuit configuration.

6 Claims, 2 Drawing Sheets

CIRCUIT CONFIGURATION FOR DETECTING A FUNCTIONAL DISTURBANCE

CROSS-REFERENCE TO RELATED APPLICATION

This application is a continuation of copending International Application No. PCT/DE01/01238, filed Mar. 29, 2001, which designated the United States and which was not published in English.

BACKGROUND OF THE INVENTION

Field of the Invention

The invention relates to a circuit configuration for detecting a functional disturbance having a first and a second differential amplifier, the outputs thereof being connected to the inputs of a gate, one input in each case being connected to a reference potential terminal and the other input in each case being coupled to the supply voltage.

In the event of low-frequency voltage fluctuations in the supply voltage, the functionality of an integrated circuit generally remains ensured. However, an undefined state of the integrated circuit can arise in the event of high-frequency disturbing pulses. By way of example, the synchronization of different signals of the integrated circuit can be disturbed.

A memory content could be read out erroneously. Equally, logic circuit configurations could be adversely influenced.

These intrinsically undesirable effects can be exploited, however, in order to discover the structural construction and the method of operation of an integrated circuit.

In order to prevent such fraudulent intentions, voltage fluctuations within a specified supply voltage range are masked out by filter circuits. In this case, however, the integrated circuit does not generally interrupt its functional sequence.

SUMMARY OF THE INVENTION

It is accordingly an object of the invention to provide a circuit configuration for detecting a functional disturbance which overcomes the above-mentioned disadvantages of the heretofore-known devices and methods of this general type and which prevents, or at least detects, functional disturbances of the abovementioned type in an integrated circuit.

With the foregoing and other objects in view there is provided, in accordance with the invention, a circuit configuration for detecting a functional disturbance, comprising:

a supply potential terminal;

first and second differential amplifiers each having an output;

a gate with inputs respectively connected to said outputs of said first and second amplifiers;

said first and second differential amplifiers each having a first input connected to a reference potential terminal and a second input connected to receive a supply voltage; and a monitoring device connected to said second input of each of said first and second differential amplifiers for responding in an event of a change in a supply voltage at said supply potential terminal.

The invention exploits the fact that a circuit configuration which monitors voltage fluctuations in the supply voltage is generally present in each integrated circuit. Integrated circuits can be operated within a predetermined supply voltage range. If the supply voltage exceeds an upper voltage threshold or if the supply voltage falls below a lower voltage threshold, then a so-called "power on reset" is triggered. This means that the integrated circuit is brought to a defined operating state after the triggering of a "power on reset". Thus, this functionality is utilized for example to trigger a power on reset whereby the integrated circuit during switch-on on account of a supply voltage rising continuously from zero, upon reaching the lower specified voltage threshold, which power on reset then switches the integrated circuit into a defined operating state. By way of example, two voltage dividers are provided for setting the lower and upper voltage thresholds, which each trigger the power on reset. The voltage divider which defines the upper switching threshold is connected to one input of the first operational amplifier, while the voltage divider which defines the lower switching threshold is connected to one input of the second operational amplifier. The respective other inputs of the first and second operational amplifiers are connected to a reference potential terminal at which a fixedly set reference voltage is present. The outputs of the first and second operational amplifiers are fed to a gate which evaluates the signal supplied by the first and second operational amplifiers and makes it available at an output. The output of this circuit configuration is connected to another circuit region of the integrated circuit, which can then trigger the power on reset.

However, since this circuit configuration for detecting a voltage fluctuation is not suitable for detecting high-frequency voltage fluctuations ranging within the reset thresholds, the invention provides for the respective other input of the first and second differential amplifiers to be connected to a monitoring device, which responds in the event of a change in the supply voltage at a supply potential terminal of the circuit configuration.

A monitoring device or monitoring means is preferably assigned to each differential amplifier.

The monitoring device may be embodied as a differentiator, for example. However, it may also be a charge storage device or accumulator connected to the supply potential terminal. The rates of change of the supply voltage at which the respective operational amplifier is to respond can be set depending on the dimensioning of the monitoring means. Preferably, the components are dimensioned in such a way that only high-frequency voltage changes in the supply voltage are detected. In this way, it is possible to prevent a disturbance in which the supply voltage fluctuates beyond acceptable thresholds which would cause functional disturbances in the sequence of the integrated circuit. Since low-frequency voltage changes generally do not impair the sequence of the integrated circuit, the monitoring means does not have to respond, in other words exceed the reference voltage which is present at the aforesaid one of the inputs of the first and second operational amplifiers.

In a preferred refinement, a voltage divider is provided between the supply potential terminal and a reference-ground potential terminal, the center tap of which voltage divider is connected to the respective monitoring means and the respective differential amplifier. As mentioned in the introduction, the voltage divider serves for setting the upper and lower voltage thresholds. Consequently, a dedicated voltage divider is provided in each case both for the first and for the second differential amplifier.

Other features which are considered as characteristic for the invention are set forth in the appended claims.

Although the invention is illustrated and described herein as embodied in a circuit configuration for detecting a functional disturbance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
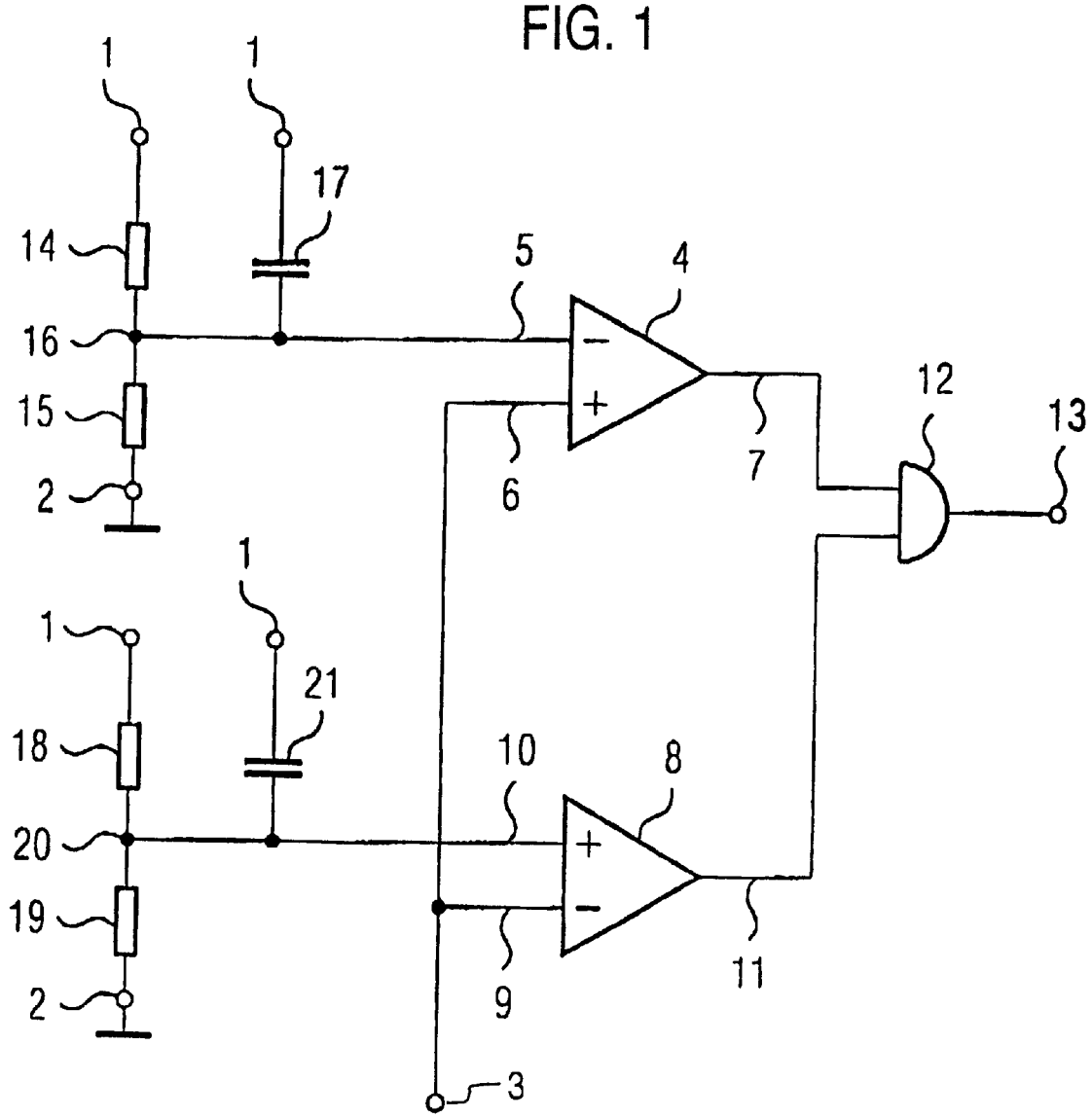
FIG. 1 is a circuit schematic of a first exemplary embodiment of the circuit configuration according to the invention for detecting a functional disturbance, with a charge storage device provided as a monitoring device.

Referring now to the figures of the drawing in detail and first, particularly, to FIG. 1 thereof, there is shown a preferred exemplary embodiment of the circuit configuration for detecting a functional disturbance. This circuit configuration makes it possible simultaneously to detect the functionality—known from the prior art—of monitoring an upper and a lower voltage threshold for the supply voltage and, on the other hand, high-frequency disturbing pulses which occur within this specified supply voltage range and to output at the output of the circuit configuration a signal which makes it possible to bring the integrated circuit to a secure state.

For this purpose, the circuit configuration has a first and a second differential amplifier 4, 8. The outputs 7, 11 of the first and second differential amplifiers 4, 8 are connected to the inputs of a gate 12. The output 13 of the gate 12 is connected to a further circuit configuration (not shown), which can trigger the power on reset. The noninverting input 6 of the first differential amplifier 4 and the inverting input 9 of the second differential amplifier 8 are connected to a reference potential terminal 3, at which a fixedly set reference voltage is present. The inverting input 5 of the first differential amplifier 4 is connected to the center tap 16 of a voltage divider, comprising resistors 14, 15. The voltage divider is connected between a supply potential terminal 1 and a reference-ground potential terminal 2. A further voltage divider, comprising the resistors 18, 19, is likewise located between the supply potential terminal 1 and the reference-ground potential terminal 2. The center tap 20 is connected to the noninverting input 10 of the second differential amplifier 8.

The resistors 14, 15 of the first voltage divider are set in such a way that a voltage which is somewhat smaller than the reference voltage at the reference potential terminal 3 is established at the center tap 16. By contrast, the resistors 18, 19 of the second voltage divider are set in such a way that a voltage which is somewhat larger than the reference voltage at the reference potential terminal 3 is established at the center tap 20. If the voltage present at the supply potential terminal 1 rises upward, then the voltage present at the center tap 16 of the first voltage divider also drifts upward. If the voltage present at the center tap 16 exceeds the reference voltage present at the noninverting input 6 of the first differential amplifier 4, then the differential amplifier 4 outputs a signal at its output 7. The OR gate 12 forwards this signal to the output 13, as a result of which a power on reset can be triggered. On the other hand, when the voltage at the supply potential terminal 1 decreases, a falling voltage is generated at the center tap 20, as a result of which the second differential amplifier 8 toggles and a signal for the power on reset is likewise generated at the output 13 of the circuit configuration.

According to the invention, a monitoring device or monitoring means is provided, which likewise causes the respective differential amplifier to toggle preferably in the event of a high-frequency change in the supply voltage. In the exemplary embodiment illustrated in FIG. 1, a charge storage device 17 (charge accumulator) is therefore provided between the center tap 16 and the supply potential terminal 1. Likewise, a charge storage device 21 is provided between the center tap 20 of the second voltage divider and the supply potential terminal 1. At a high frequency, that is to say a steep rise in the voltage, the charge storage devices 17, 21 act like a bridge and raise the voltage at the inverting input 5 and the noninverting input 10, respectively, of the first and the second differential amplifier 4, 8, respectively, above the reference voltage at the other input and generate a power on reset signal in this way. Therefore, in the event of an attack which aims to bring about functional disturbances in the signal sequence, the integrated circuit can bring the latter into a secure operating state. A secure operating state may be, for example, the stopping of the integrated circuit. It would then no longer be possible to read out the memory contents of a memory chip.

The circuit configuration according to the invention for detecting a functional disturbance is distinguished by the fact that only a few additional components are necessary compared with a circuit configuration already existing in the prior art. By the provision of a simple charge storage device, a circuit configuration which serves for monitoring predetermined voltage switching thresholds can be used to avert unintentional functional disturbances.

Figure 2:
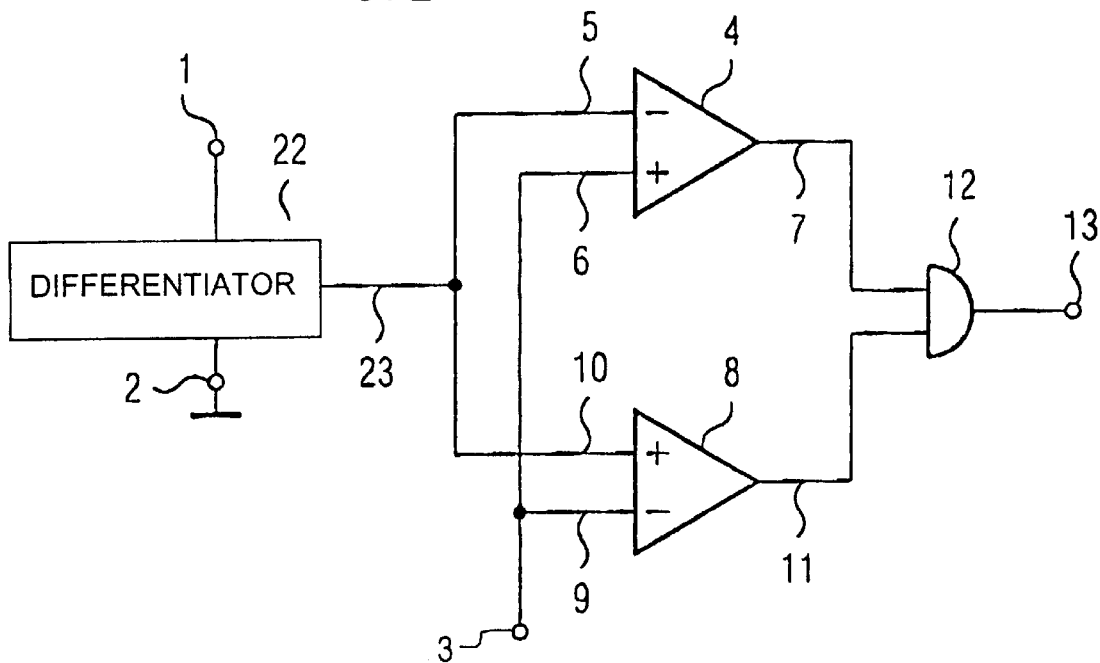
FIG. 2 is a circuit schematic of a second exemplary embodiment of the circuit configuration according to the invention for detecting a functional disturbance, with a differentiator provided as a monitoring device.

An alternative exemplary embodiment is shown in FIG. 2. The circuit configuration shown therein serves only for detecting a functional disturbance. The monitoring of an upper and lower voltage threshold is not provided in this exemplary embodiment. Instead of the inverting input 5 of the first differential amplifier 4 and the noninverting input 10 of the second differential amplifier 8 being connected up to a respective voltage divider, the two aforementioned inputs of the differential amplifiers 4, 8 are connected to one another. The node is connected to the output 23 of a differentiator 22 connected between the supply potential terminal 1 and the reference-ground potential terminal 2. The voltage rise can be detected in a simple manner by means of the differentiator. The voltage rise is a measure of the frequency of the voltage change. The differentiator may be designed, in principle, in any desired manner. Positive voltage rises are then detected by the first differential amplifier 4 in the manner described above, while voltage rises in the negative direction are detected by the second differential amplifier 8.

Figure 3:
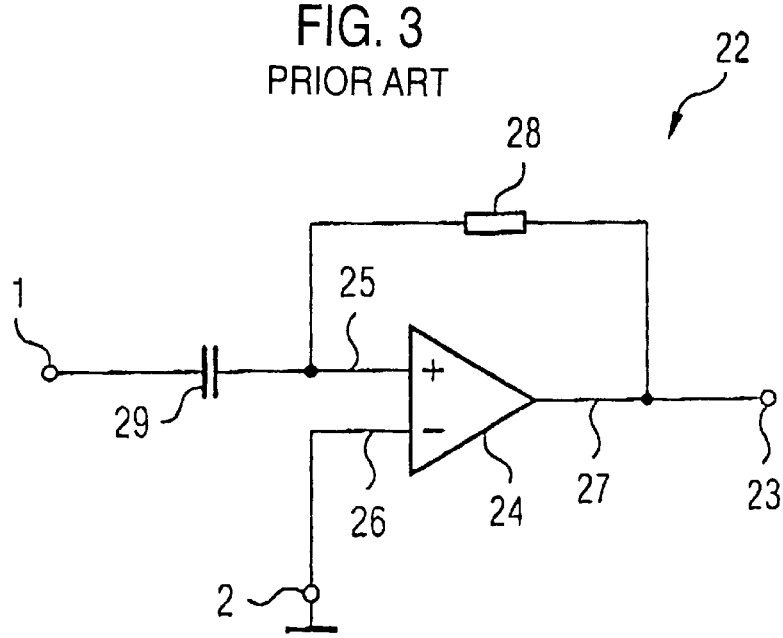
FIG. 3 is a circuit schematic of an embodiment of a differentiator which is used in the circuit configuration according to FIG. 2.

FIG. 3 shows an exemplary embodiment of a differentiator which, by itself, is known from the prior art. The differentiator has a differential amplifier 24, whose noninverting input is connected to the reference-ground potential terminal 2. The inverting input 25 is connected to the supply potential terminal 1 via a charge storage device 29.

Furthermore, the inverting input 25 is connected to the output 27 of the differential amplifier 24 via a resistor 28. The output of the differential amplifier 24 represents, as it were, the output 23 of the differentiator 22.

We claim:

1. A circuit configuration for detecting a functional disturbance, comprising:

a supply potential terminal;

first and second differential amplifiers each having an output;

a gate with inputs respectively connected to said outputs of said first and second amplifiers;

said first and second differential amplifiers each having a first input connected to a reference potential terminal and a second input connected to receive a supply voltage; and a monitoring device connected to said second input of each of said first and second differential amplifiers for responding in an event of a change in a supply voltage at said supply potential terminal.

2. The circuit configuration according to claim 1, wherein said monitoring device is configured to detect substantially only high-frequency voltage changes in the supply voltage.

3. The circuit configuration according to claim 1, wherein said monitoring device is one of two monitoring devices respectively assigned to each of said differential amplifiers.

4. The circuit configuration according to claim 1, wherein said monitoring device is a differentiator.

5. The circuit configuration according to claim 1, wherein said monitoring device is a charge storage device connected to said supply potential terminal.

6. The circuit configuration according to claim 3, which comprises a voltage divider connected between said supply potential terminal and a reference-ground potential terminal, said voltage divider having a center tap connected to a respective said monitoring device and a respective said differential amplifier.

* * * * *